(12) United States Patent
Duensing et al.

(10) Patent No.: US 7,141,971 B2
(45) Date of Patent: Nov. 28, 2006

(54) METHOD AND APPARATUS FOR ENHANCED MULTIPLE COIL IMAGING

(75) Inventors: G. Randy Duensing, Gainesville, FL (US); Steve Varosi, Gainesville, FL (US); Scott B. King, Gainesville, FL (US)

(73) Assignee: Invivo Corporation, Orlando, FL (US)

( * ) Notice: Subject to any disclaimer, the term of this patent is extended or adjusted under 35 U.S.C. 154(b) by 0 days.

(21) Appl. No.: 11/269,968

(22) Filed: Nov. 8, 2005

(65) Prior Publication Data

US 2006/0055405 A1  Mar. 16, 2006

Related U.S. Application Data

(63) Continuation of application No. 10/174,843, filed on Jun. 18, 2002, now Pat. No. 7,057,387.

(60) Provisional application No. 60/299,012, filed on Jun. 18, 2001.

(51) Int. Cl.
    *G01V 3/00* (2006.01)
(52) U.S. Cl. ..................... 324/307; 324/309
(58) Field of Classification Search .............. None
    See application file for complete search history.

(56) References Cited

U.S. PATENT DOCUMENTS

| | | | |
|---|---|---|---|
| 4,885,541 A | 12/1989 | Hayes | |
| 4,947,121 A | 8/1990 | Hayes | |
| 5,587,656 A | 12/1996 | Van Heels-Bergen et al. | |
| 5,864,234 A * | 1/1999 | Ludeke | 324/309 |
| 6,160,398 A | 12/2000 | Walsh | |
| 6,771,067 B1 * | 8/2004 | Kellman et al. | 324/307 |
| 7,057,387 B1 * | 6/2006 | Duensing et al. | 324/309 |
| 2002/0167315 A1 * | 11/2002 | Kellman et al. | 324/307 |
| 2003/0038632 A1 * | 2/2003 | Duensing et al. | 324/307 |
| 2006/0055405 A1 * | 3/2006 | Duensing et al. | 324/307 |

FOREIGN PATENT DOCUMENTS

WO  WO 01/73463 A1  10/2001

OTHER PUBLICATIONS

King, Scott B. et al., "A Comparison of 1, 4 and 8 Channel Phased Array Head Coils and 1.5T", Proc. Intl. Soc. Mag. Reson. Med., vol. 9 (2001), p. 1090.

Varosi, Stephen M. et al., "A Hardware Combiner to Achieve 'Optimal 'SNR Using Sum-Of-Squares Reconstruction", Abstract No. 768, p. 74, 10th Intl. Society for Magnetic for Magnetic Resonance in Medicine Proceedings, published May 2002.

Hayes, Cecil E. et al., "Noise Correlations in Data Simultaneously Acquired from Multiple Surface Coil Arrays", *Magnetic Resonance in Medicine*, Nov. 1, 1990, pp. 181-191, vol. 16, No. 2, Academic Press, Duluth, MN, US.

Pruessmann, Klaas Paul et al., "Advances in Sensitivity Encoding with Arbitrary k-Space Trajectories", *Proc. Intl. Soc. Mag. Reson. In Medicine*, 9th Scientific Meeting and Exhibition, European Society for Magnetic Resonance in Medicine and Biology, 18th Annual Meeting and Exhibition, Apr. 21-27, 2001, vol. 1, p. 4.

Roemer P.B. et al., "The NMR Phased Array", *Magnetic Resonance in Medicine*, Nov. 1, 1990, pp. 192-225, vol. 16, No. 2, Academic Press, Duluth, MN, US.

* cited by examiner

Primary Examiner—Diego Gutierrez
Assistant Examiner—Tiffany A. Fetzner
(74) Attorney, Agent, or Firm—Saliwanchik, Lloyd & Saliwanchik

(57) ABSTRACT

The subject invention pertains to a method and apparatus for enhanced multiple coil imaging. The subject invention is advantageous for use in imaging devices, such as MRIs where multiple images can be combined to form a single composite image. In one specific embodiment, the subject method and apparatus utilize a novel process of converting from the original signal vector in the time domain to allow the subject invention to be installed in-line with current MRI devices.

22 Claims, 4 Drawing Sheets

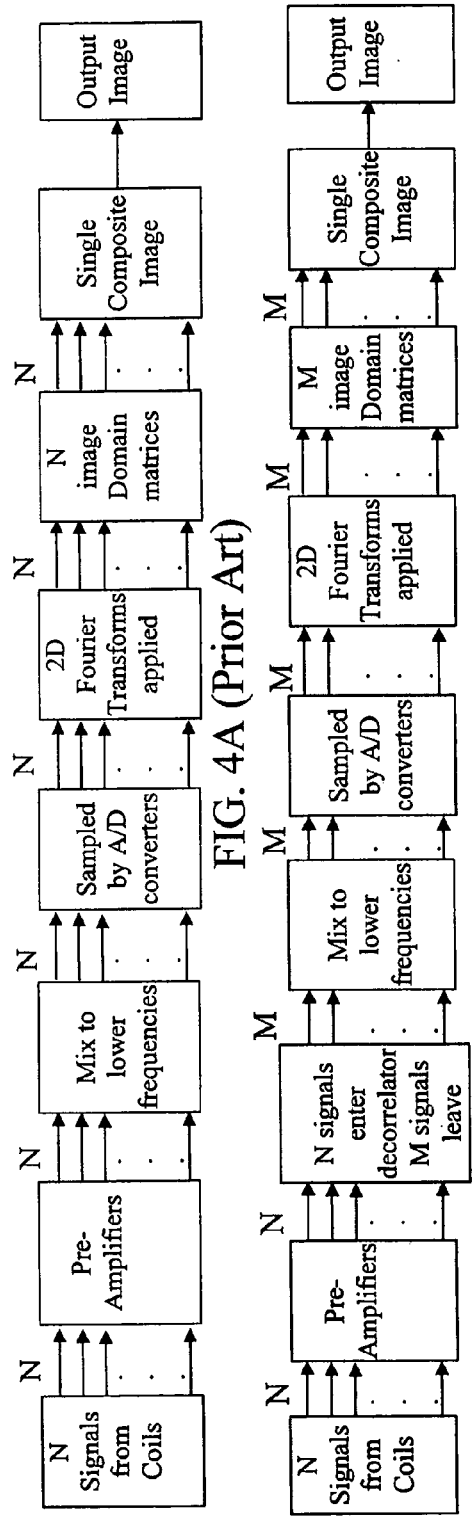
FIG. 4A (Prior Art)
FIG. 4B
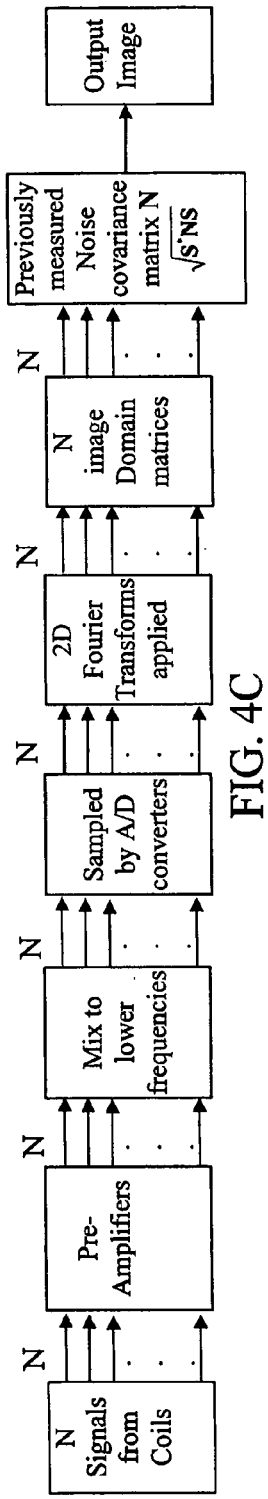
FIG. 4C
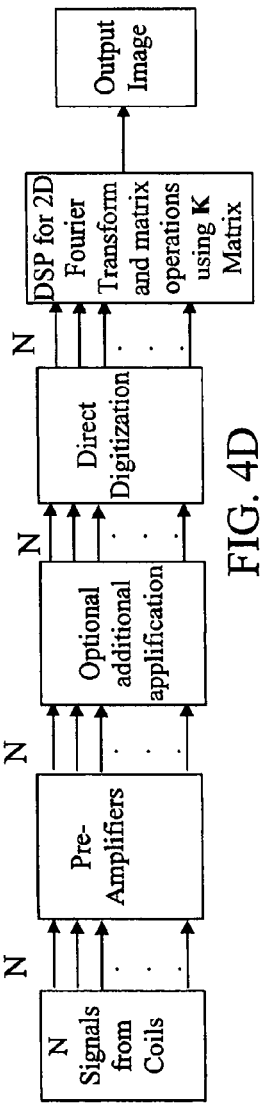
FIG. 4D

METHOD AND APPARATUS FOR ENHANCED MULTIPLE COIL IMAGING

CROSS-REFERENCE TO RELATED APPLICATION

The present application is a continuation of U.S. application Ser. No. 10/174,843, filed Jun. 18, 2002, now U.S. Pat. No. 7,057,387 which claims the benefit of U.S. Provisional Application Ser. No. 60/299,012, filed Jun. 18, 2001, which are hereby incorporated by reference herein in their entirety, including any figures, tables, or drawings.

The subject invention was made with government support under a research project supported by the National Institutes of Health (NIH), Department of Health and Human Services, Grant Number 5R44 RR11034-03. The government has certain rights in this invention.

BACKGROUND OF THE INVENTION

The subject invention relates to the field of medical technology and can provide for an improved method of creating composite images from a plurality of individual signals. The subject invention is particularly advantageous in the field of magnetic resonance imaging (MRI) where many individual images can be used to create a single composite image.

In the early stages of MRI development, typical MRI systems utilized a single receiver channel and radio frequency (RF) coil. In order to improve performance, multi-coil systems employing multiple RF coils and receivers can now be utilized. During operation of these multi-receiver systems, each receiver can be used to produce an individual image of the subject such that if there is n receivers there will be n images. The n images can then be processed to produce a single composite image.

Many current systems incorporate a sum-of-squares (SOS) algorithm, where the value of each pixel in the composite image is the square-root of the sum of the squares of the corresponding values of the pixels from each of the n individual images. Where the pixel values are complex, the value of each pixel in the composite image is the square-root of the sum of the magnitude squared of the corresponding pixels from each of the individual images. In mathematical terms, if n coils produce n signals $S=[s_1, s_2, \ldots, s_n]$ corresponding to the pixel values from a given location, the composite signal pixel is given by the following equation:

$$\sqrt{S^* \cdot S} = \sqrt{\sum_{j=1}^{n} \overline{S_j} \cdot S_j} = \sqrt{\sum_{j=1}^{n} |S_j|}$$

where S* is the conjugate row-column transpose of the column vector, S. Some systems also incorporate measurement and use of the noise variances of each coil. Define the n×n noise covariance matrix, N, in terms of noise expectation <•>, by the formula:

$$N_{i,j} = \langle (s_i - \langle s_i \rangle) \cdot \overline{(s_j - \langle s_j \rangle)} \rangle$$

The diagonal entries of N are the noise variances of each coil. Each of the n individual channel gains can then be adjusted after acquisition to produce equal noise variance individual images. Following this procedure, the SOS algorithm can then be applied. This additional procedure tends to improve the signal-to-noise ratio (SNR) of the process but may still fail to optimize the SNR of the resultant composite image. This results in an equation:

$$\sqrt{S^* \cdot [\mathrm{Diag}(N)]^{-1} \cdot S}$$

It can be shown that the SOS algorithm is optimal if the noise covariance matrix is the identity matrix. In order to further optimize the SNR of the resultant composite image, it would be helpful to have knowledge of the noise covariance matrix. Optimal SNR reconstruction in the presence of noise covariance can be summarized by the following simple equation:

$$\sqrt{S^* \cdot [N]^{-1} \cdot S}$$

U.S. Pat. Nos. 4,885,541 and 4,946,121 discuss algorithms relating to equations which are similar in form. Typically this method is applied in the image domain, after acquisition and Fourier transformation into separate images.

BRIEF SUMMARY OF THE INVENTION

The subject invention pertains to a method and apparatus for improved processing of electrical signals. A specific embodiment of the subject invention can be used with MRI devices. The subject method and apparatus can be used to combine a plurality of individual images into a single composite image. The composite image can have reduced distortion and/or increased signal to noise ratio. In one embodiment, the subject method and apparatus can be installed as an aftermarket addition to existing MRI devices in order to take advantages of the method herein described. In another embodiment, the subject invention can be incorporated into new MRI devices and/or systems.

BRIEF DESCRIPTION OF THE DRAWINGS

FIG. 4A shows a flowchart for standard SOS processing.

FIG. 4B shows a flowchart for a specific embodiment of the subject invention.

FIG. 4C shows a flowchart for a specific embodiment of the subject invention.

FIG. 4D shows a flowchart for a specific embodiment of the subject invention.

DETAILED DESCRIPTION OF THE INVENTION

Figure 1:
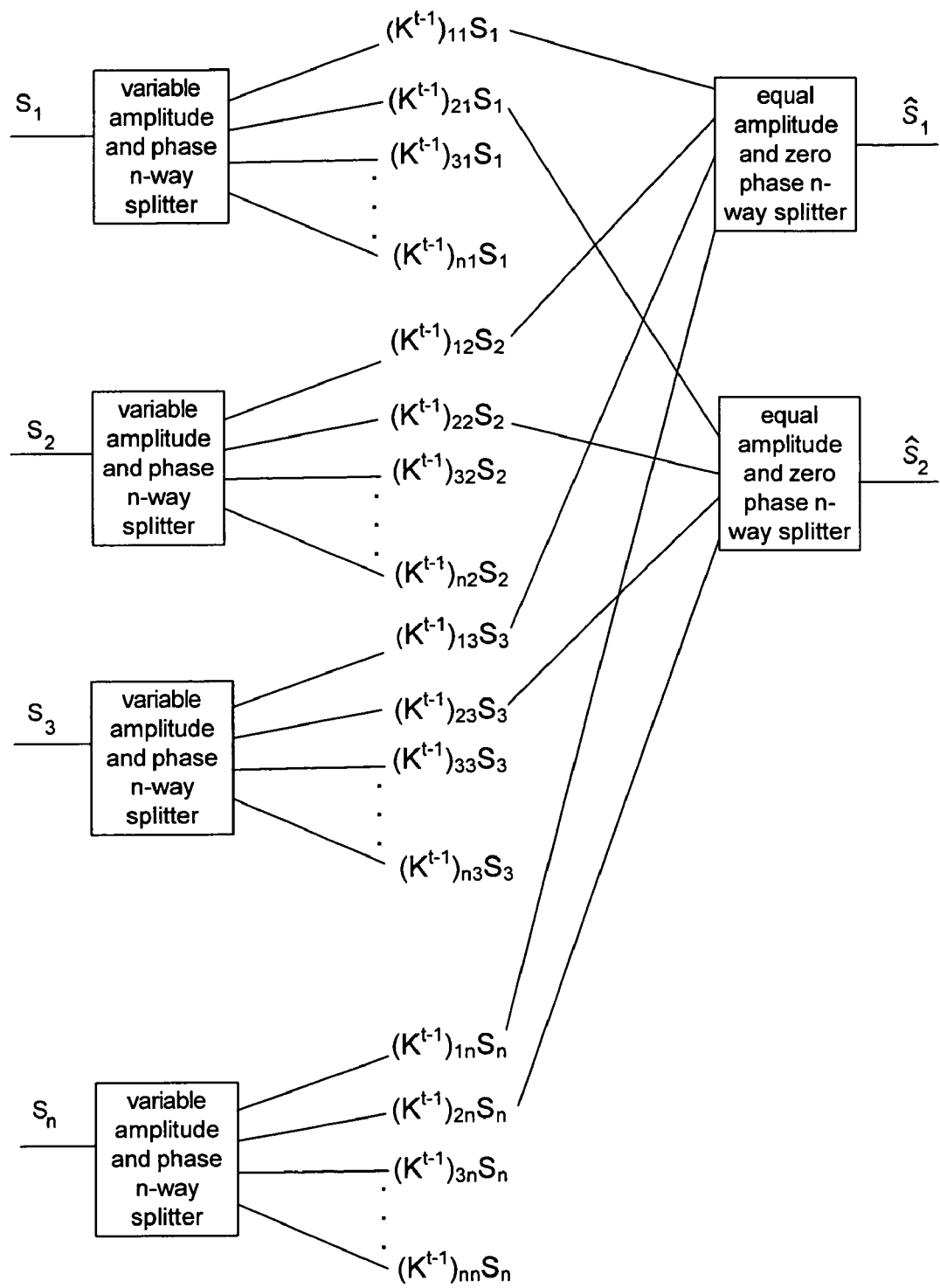
FIG. 1 shows a schematic representation of a specific embodiment of the subject invention.

The subject invention pertains to a method and apparatus for enhanced multiple coil imaging. The subject invention is advantageous for use in imaging devices, such as MRIs where multiple images can be combined to form a single composite image. In one specific embodiment, the subject method and apparatus utilize a novel process of converting from the original signal vector in the time domain to allow the subject invention to be installed in-line with current MRI devices.

An MRI device, which could be used with the subject invention, typically has multiple RF coils and receivers where each coil can produce an image of the subject. Thus, a preferred first step in the use of a multi-receiver MRI system is to produce n data sets which could be used to produce n images, one from each of the n receivers employed by the device. In typical MRI devices, a next step can be to produce a single composite image using the n individual images. This composite imaging is commonly formed through the manipulation of the n individual images in a sum-of-squares (SOS) algorithm. In this process, the value of each pixel in the composite image is the square-root of the sum of the squares of the corresponding values of the pixels from each of the n individual images. Where the pixel values are complex, the value of each pixel in the composite image is the square-root of the sum of the magnitude squared of the corresponding pixels from each of the individual images. In mathematical terms, if n coils produce n signals $S=[s_1, s_2, \ldots, s_n]$ corresponding to the pixel values from a given location, the composite signal pixel is given by the following equation:

$$\sqrt{S^* \cdot S}$$

Some systems also incorporate measurement and use of the noise variances of each coil. Define the n×n noise covariance matrix, N, in terms of noise expectation <•>, by the formula:

$$N_{i,j} = \langle (s_i - \langle s_i \rangle) \cdot \overline{(s_j - \langle s_j \rangle)} \rangle$$

The diagonal entries of N are the noise variances of each coil. Each of the n individual channel gains can then be adjusted after acquisition to produce equal noise variance individual images. Following this procedure, the SOS algorithm can then be applied. This additional procedure tends to improve the signal-to-noise ratio (SNR) of the process but may still fail to optimize the SNR of the resultant composite image. This results in an equation:

$$\sqrt{S^* \cdot [Diag(N)]^{-1} \cdot S}$$

It can be shown that the SOS algorithm is optimal if noise covariance matrix is the identity matrix. In order to further optimize the SNR of the resultant composite image, it would be helpful to have knowledge of the relative receiver profiles of all the coils and knowledge of the noise covariance matrix. For illustrative purposes, the noise covariance matrix can be referred to as N, a n×n Hermitian symmetric matrix. One can also consider optimal given no a priori knowledge (i.e. no information about the coil receive profiles). Optimal then considers only the knowledge of the noise covariance matrix and assumes that the relative pixel value at each location is approximately the relative reception ability of each coil. It can be shown that the SOS algorithm is optimal if the noise covariance matrix is the identity matrix. This method can be summarized by the following simple equation:

$$\sqrt{S^* \cdot [N]^{-1} \cdot S}$$

U.S. Pat. Nos. 4,885,541 and 4,946,121, which are hereby incorporated herein by reference, discuss algorithms relating to equations which are similar in form. Typically this method is applied in the image domain, after acquisition and Fourier transformation into separate images. In order to further optimize the SNR of the resultant composite image, it would be helpful to have knowledge of the relative receiver profiles of all the coils and knowledge of the noise covariance matrix. As the matrix $N^{-1}$ is Hermitian symmetric, $N^{-1}$ can therefore be expressed in an alternate form as $N=K^*K$.

This allows the equation above to be rewritten as:

$$\sqrt{S^* \cdot [K^*K]^{-1} \cdot S} = \sqrt{(S^*K^{-1})(K^*)^{-1}S)} =$$
$$\sqrt{((K^{-1})^*S)^* \cdot ((K^{-1})^*S)}$$

$$\sqrt{S^* \cdot [K^*K]^{-1} \cdot S} = \sqrt{(S^*K^{-1})((K^*)^{-1}S)} =$$
$$\sqrt{((K^*)^{-1}S)^* \cdot ((K^*)^{-1}S)}$$

This is now in the form:

$$\sqrt{\hat{S}^* \cdot \hat{S}}$$

Therefore, it is as if the conventional SOS algorithm is performed on a new vector, $\hat{S}=(K^{-1})^* \cdot S$ $\hat{S}=(K^*)^{-1} \cdot S$. Viewed another way, this optimal equation is equivalent to a Sum of Squares operation after a basis transformation to an uncorrelated basis. The new basis can be considered channels that are noise eigenmodes of the original coil. In a specific embodiment of the subject invention, the process of converting from the original signal vector to a new signal vector can be a linear process corresponding to, for example, multiplication by constant values and addition of vector elements, as shown in the following set of equations:

$$\hat{s}_1 = a_{1,1}s_1 + a_{1,2}s_2 + \ldots + a_{1,n}s_n$$

$$\hat{s}_2 = a_{2,1}s_1 + a_{2,2}s_2 + \ldots + a_{2,n}s_n$$

$$\hat{s}_n = a_{n,1}s_1 + a_{n,2}s_2 + \ldots + a_{n,n}s_n$$

wherein $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are constants. When only multiplication by constant values and addition of vector elements are used, the process can occur before or after Fourier Transformation. That is, the process can occur in the time domain or in the image domain.

Accordingly, the subject method and apparatus can operate in the time domain to convert an original signal vector, which is typically in a correlated noise basis, to a new signal vector, which can be in an uncorrelated noise basis. In a specific embodiment of the subject invention, standard reconstruction algorithms for producing composite images can be used. These algorithms are already in place on many multi-channel MRI systems. In addition, it may be possible to apply other algorithms for spatial encoding such as SMASH and SENSE with better efficiency.

In a specific embodiment, the subject method and apparatus can incorporate the processing of each signal with the coil so that the processing does not show to a user, such as to create the effect of "pseudo coils" having 0 noise covariance. The subject invention can be implemented via software and/or hardware.

FIG. 1 shows a schematic representation of a specific embodiment of the subject invention. This embodiment can be placed after preamplification and can also be placed within a specific coil package. The device parameters can be gathered from average noise covariance data obtained, for example, from tests on typical subjects. Alternatively, the noise parameters can be obtained internal to the device using noise correlators whose outputs could be used to set gains or attenuations to produce the desired result. Alternative embodiments can be placed before preamplifications.

The subject method can allow for a reduction in the number of channels and, in a specific embodiment, be generalized to an optimal reduction in the number of channels. In some embodiments, a coil array can have some degree of symmetry. With respect to coil arrays having some degree of symmetry, there can exist eigenvalues with degenerate eigenvectors. Generally, two eigenvectors with the same (or similar) eigenvalue can represent similar effective imaging profiles, often having some shift or rotation in the patterns, where two eigenvectors with similar, but not identical eigenvalues can be considered substantially degenerate eigenvectors. Accordingly, channels with the same eigenvalues can be added with some particular phase, resulting in little loss in SNR and partially parallel acquisition (PPA) capability. This can allow for maximizing the information content per channel. In a specific embodiment, adding the signals from channels with identical (or similar) eigenvalues, the number of channels may be reduced from n to m, where m<n, channels with little loss in performance. In a specific embodiment, such a reduction in the number of channels can be implemented with respect to quadrature volume coil channels. For example, if two volume coils or modes have fields which are uniform and perpendicular, then the circularly polarized addition of these fields, for example by adding the fields 90 degrees out of phase, can allow all of the signal into one channel and no signal into the other channel. In this example, the use of a phased addition associated with the uniform modes both having the same eigenvalves and being related through a rotation of 90 degrees allows the conversion of two coils to one channel to be accomplished.

Referring to FIGS. 4A–4B, a comparison of the standard method for producing a single composite image from the output signals of N coils to an embodiment of the subject invention which incorporates a decorrelator into which N signals are inputted and M signals are outputted, where M≦N, such that a single composite image is produced from the M outputted signals after processing. FIGS. 4C and 4D show flowcharts for other embodiments of the subject invention. FIG. 4A shows a flowchart for the standard method of producing a single composite image from the output signals of N coils in a MRI system. The N signals are preamplified and then mixed to lower frequencies. The N lower frequency signals are then sampled by A/D converters to produce N digital signals. 2D Fourier Transforms are applied to the N digital signals followed by multiplication by N image domain matrices to produce a single composite image. FIG. 4B shows a flowchart for a specific embodiment of the subject invention similar to the standard method of FIG. 4A with the N signals outputted from the preamplifier inputted to a decorrelator which outputs M signals, where M≦N. Accordingly, the remaining processing shown in FIG. 4B is for M signals, rather than N. FIG. 4C shows a flowchart for another specific embodiment of the subject invention which can implement the "optimal" reconstruction utilizing a software implementation. In this embodiment, the software implementing the optimal reconstruction is based on the previously measured noise covariance matrix N, such that processing of the N signals outputted after processing by the N image domain matrices produces the output image. FIG. 4D shows the flowchart for another specific embodiment in accordance with the subject invention where, after preamplification and optional additional amplification, the N signals from the N coils undergo direct digitization and are inputted to a DSP for 2D Fourier Transform and matrix operations using the K matrix, where N is the noise covariance matrix and N=K*K to produce an output image. This approach would be a more efficient algorithm than prior art would provide.

EXAMPLE 1

Figure 5:
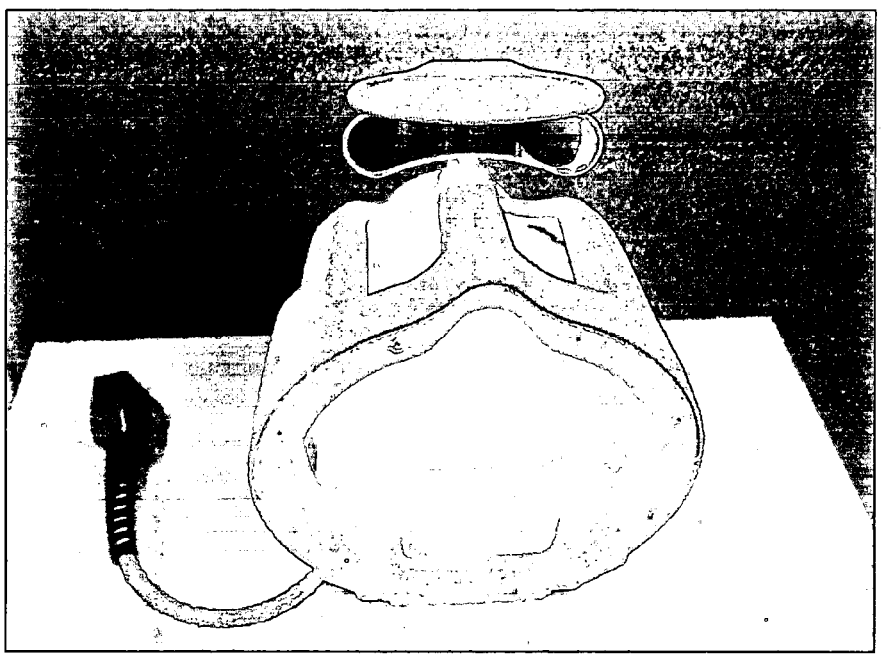
FIG. 5 shows an embodiment of a 4-channel head coil in accordance with the subject invention.

This example describes a 4-channel hardware RF combiner network which realizes a basis change to reduced noise correlation. The RF combiner network can realize a basis change to minimal noise correlation. Such a basis change to minimal noise correlation can optimize SNR achievable using the Sum-of-Squares reconstruction method. The network can be realized using passive RF components. A specific embodiment was tested specifically using a 4-channel head coil (FIG. 5) on a 1.5 T scanner. SNR gains of over 30% can be achieved in the periphery, with corresponding loss in uniformity. Noise correlation can be greatly reduced when using the combiner. Results from the measurements agree closely with software techniques.

A head coil design has demonstrated greater than 20% peripheral SNR gain by using "optimal" reconstruction offline from raw data. "Optimal" can be defined as reconstructing with the highest SNR using the signal plus noise as an estimate of the true signal, but with the full noise covariance matrix taken into account. The standard Sum-of-Squares reconstruction can be optimized for SNR by employing the noise correlation matrix. However, there are practicality issues and can be a lack of any substantial gain in image quality (i.e. 10% or less). The Sum of Squares (with normalized variances) can be optimal if the noise covariance matrix is diagonal (no correlation between channels). To achieve this gain in clinical practice, a hardware combiner circuit has been developed to achieve this SNR gain for a specific coil on a typical MRI scanner without software modification.

The standard Sum-of-Squares (SoS) reconstruction from an n-channel array for each pixel is $P_{SoS} = \sqrt{S^* \cdot S}$ where $S = [s_1, s_2, \ldots, s_n]$. The optimal reconstruction using only signal data is $P_{opt} = \sqrt{S^* \cdot [N]^{-1} \cdot S}$ where N is the noise correlation matrix. To yield this optimal result from a standard SoS operation, a signal basis change can be employed. Since in general $N^* = N$, there exists a K constructed via eigenvalue/vector decomposition such that $N = K^* K$ and so $P_{opt} = \sqrt{S^* \cdot [K^* k]^{-1} \cdot S} = \sqrt{((K^{-1})^* S)^* \cdot ((K^{-1})^* S)} P_{opt} = \sqrt{S^* \cdot [K^* K]^{-1} \cdot S} = \sqrt{((K^*)^{-1} S)^* \cdot ((K^*)^{-1} S)}$. Thus we can define $\hat{S} = (K^{-1})^* \cdot S$ $\hat{S} = (K^*)^{-1} \cdot S$ as our new signal vector and $P_{opt} = \sqrt{\hat{S}^* \cdot \hat{S}}$ which is just a SoS operation.

In hardware, multiplication of the 4 element signal vector s by a matrix is equivalent to using a 4-in-to-4-out network which in general is complicated by phase shifts and gain scaling, and must almost certainly be placed after preamplification. The 4-channel head coil used in this example has 4 sets of opposing parallel-combined loops and was described in King, S. B. et al. 9$^{th}$ ISMRM proceedings, p. 1090, 2001, which is incorporated herein by reference and includes eight domed surface coil elements (diameter=11 cm) with opposing loops combined to produce 4-channels. Adjacent elements were overlapped for zero mutual inductance. SNR dependence on coupling was estimated from loaded Q-measurements (QL) with shorts and low impedance terminations placed after a 90° matching network. Only the next nearest neighbor produced significant drop in QL when terminated in low impedance rather than direct short. Therefore, only next nearest neighbors were isolated by shared inductance. Unloaded isolations were all greater than 18 dB. In addition, all coils were placed on identical formers with diameter 23.5 cm and length 22 cm. Its symmetry yields an all-real noise correlation matrix and corresponding signal basis change matrix of the form shown below:

$$N = \begin{bmatrix} 1 & .5 & .5 & .1 \\ .5 & 1 & .1 & -.5 \\ .5 & .1 & 1 & .5 \\ .5 & -.5 & .5 & 1 \end{bmatrix} (K^{-1})^* = \begin{bmatrix} -.7 & 1 & 0 & .7 \\ .7 & 1 & 0 & -.7 \\ .7 & 0 & 1 & .7 \\ .7 & 0 & -1 & .7 \end{bmatrix}$$

The basis change matrix diagonalizes N, so in the new basis there is no noise correlation, which maximizes SNR.

Figure 2:
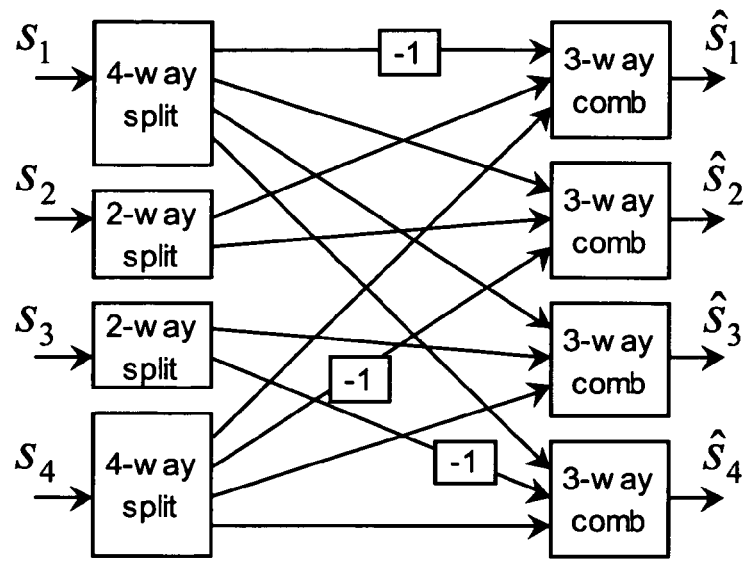
FIG. 2 shows a schematic representation of a specific embodiment of the subject invention.

The ±0.7 entries in K are just 3 dB attenuations, resulting in the very simple circuit realization of FIG. 2. Each 4-way splitter output is 3 dB lower than each 2-way output so no additional attenuations are needed. The −1 polarity inversions are realized using baluns. All components are standard RF parts which utilize ferrite cores, so the circuit was kept far out of the bore.

Figure 3:
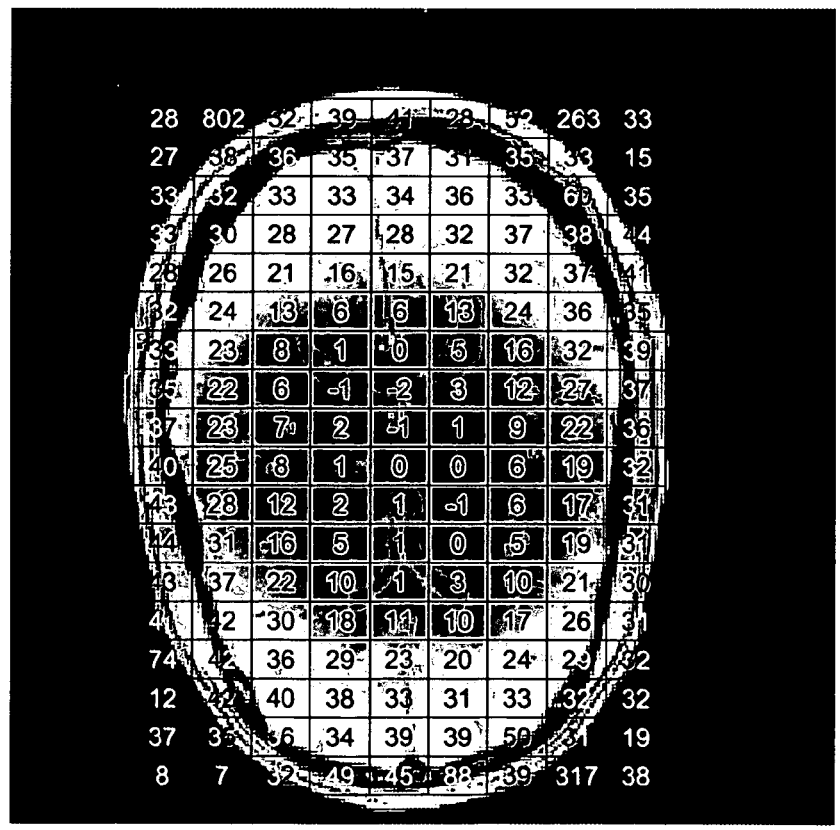
FIG. 3 shows a clinical image superimposed with percent gains of the optimal SNR with respect to the embodiments shown in FIG. 2 over standard SOS SNR.

Images were made using a 1.5 T scanner. FIG. 3 shows a clinical image superimposed with percent gains of the hardware-optimal SNR over regular SoS SNR. The combiner circuit was easily inserted and removed without disturbing the coil to enable accurate comparisons.

Clearly the SNR gain is mainly in the periphery and the resulting image suffers in uniformity between the center and the periphery. Hardware results are also in close agreement with software-optimal reconstruction using normal coil data. Noise correlation is significantly decreased when using the hardware-optimal combiner, and the matrix is nearly diagonal as expected:

Noise Correlation Matrices

| Normal Coil | | | | w Hardware Combiner | | | |
|---|---|---|---|---|---|---|---|
| 1.00 | 0.50 | 0.40 | 0.11 | 1.00 | 0.05 | 0.12 | 0.05 |
| 0.50 | 1.00 | 0.10 | 0.57 | 0.05 | 1.00 | 0.07 | 0.15 |
| 0.40 | 0.10 | 1.00 | 0.48 | 0.12 | 0.07 | 1.00 | 0.10 |
| 0.11 | 0.57 | 0.48 | 1.00 | 0.05 | 0.15 | 0.10 | 1.00 |

The results of this example illustrate that a hardware De-correlator can be used to approximate "optimal" reconstruction using software sums of squares algorithm. As the symmetry of noise covariance entries is more important than particular values, this device can show robustness across different loading conditions.

SENSE and SMASH reconstruction algorithms use the noise correlation routinely, so the use of a hardware combiner solely to achieve better SNR is limited. However, this and similar combiners may find use in reducing computational time and improving numerical stability in the various new reconstruction algorithms being developed.

It should be understood that the examples and embodiments described herein are for illustrative purposes only and that various modifications or changes in light thereof will be suggested to persons skilled in the art and are to be included within the spirit and purview of this application and the scope of the appended claims.

The invention claimed is:

1. A method of processing magnetic resonance imaging signals from a plurality of magnetic resonance imaging coils, comprising:

receiving a plurality of signals, $s_1, s_2, \ldots, s_p$, from a corresponding plurality of magnetic resonance coils;

creating a subset of the plurality of signals, $s_1, s_2, \ldots, s_n$, corresponding to a subset of the plurality of magnetic resonance coils, where n<p, to produce signal vector $S=[s_1, s_2, \ldots, s_n]$, wherein the subset of the plurality of signals represent a corresponding plurality of pixel values for a location;

determining a noise covariance matrix, N, of the subset of the plurality of magnetic resonance imaging coils, wherein the noise covariance matrix, N, of the subset of the plurality of magnetic resonance imaging coils is a Hermitian symmetric matrix;

converting signal vector S to signal vector $\hat{S}$, where, $\hat{S}=(K^*)^{-1} \cdot S$ and $N=K^*K$, where K is a matrix for which the conjugate row-column transpose of K, K*, multiplied by the matrix K is the noise covariance matrix, N;

calculating a composite pixel value for the location, $\sqrt{\hat{S}^* \cdot \hat{S}}$, where $\hat{S}^* = [(K^*)^{-1} \cdot S]^*$ and producing a pixel for the location in an image, wherein the pixel for the location in the image has the calculated composite pixel for the location.

2. The method according to claim 1, wherein converting signal vector S to signal vector $\hat{S}$ comprises converting signal vector S to signal vector $\hat{S}$ in the time domain.

3. The method according to claim 1, wherein $\hat{S}=[\hat{s}_1, \hat{s}_2, \ldots, \hat{s}_n]$ is produced by inputting $S=[s_1, s_2, \ldots, s_n]$ into a circuit, wherein the output of the circuit is $\hat{s}_1 = a_{1,1}s_1 + a_{1,2}s_2 + \ldots + a_{1,n}s_n$ $\hat{s}_2 = a_{2,1}s_1 + a_{2,2}s_2 + \ldots + a_{2,n}s_n$ $\hat{s}_n = a_{n,1}s_1 + a_{n,2}s_2 + \ldots + a_{n,n}s_n$ wherein $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are constants.

4. The method according to claim 3, wherein $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are values of $(K^*)^{-1}$ such that $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are equal to $(K^*)^{-1}_{1,1}, (K^*)^{-1}_{1,2}, \ldots, (K^*)^{-1}_{1,n}, (K^*)^{-1}_{2,1}, (K^*)^{-1}_{2,2}, \ldots, (K^*)^{-1}_{2,n}, \ldots (K^*)^{-1}_{n,1}, (K^*)^{-1}_{n,2}, \ldots, (K^*)^{-1}_{n,n}$, respectively.

5. The method according to claim 4, wherein K is constructed via eigenvalue/vector decomposition of the noise covariance matrix N.

6. The method according to claim 5, wherein when the eigenvalue/vector decomposition of N yields one or more eigenvalues with substantially degenerate eigenvectors, the values of $(K^*)^{-1}$ are adjusted such that the output of the circuit is $\hat{S}=[\hat{s}_1, \hat{s}_2, \ldots, \hat{s}_m]$ where m<n.

7. The method according to claim 6, wherein substantially all of the image information in received signals $S=[s_1, s_2, \ldots, s_n]$ is in output signals $\hat{S}=[\hat{s}_1, \hat{s}_2, \ldots, \hat{s}_m]$.

8. The method according to claim 6, wherein the adjustment of the values of $(K^*)^{-1}$ results in the received signals with substantially the same eigenvalues being added together with a phase.

9. The method according to claim 8, wherein two of the received signals are received from quadrature volume coils having fields which are substantially uniform and substantially perpendicular, wherein the values of $(K^*)^{-1}$ are adjusted to accomplish the circularly polarized addition of the two received signals, such that substantially all of the image information in the two received signals is in one output signal.

10. The method according to claim 4, further comprising: pre-amplifying the received signals prior to inputting $S=[s_1, s_2, \ldots, s_n]$ into the circuit.

11. The method according to claim 10, further comprising:
   mixing output signal $\hat{S}$ to lower frequencies;
   sampling $\hat{S}$ with a lower frequency by A/D converters to produce a digital $\hat{S}$ signal;
   applying a 2D Fourier Transform to the digital $\hat{S}$ signal; and
   processing the $\hat{S}$ signal after 2D Fourier Transform applied with image domain matrices to produce a plurality of pixel values, $\hat{S}$, for a location,
   wherein a composite pixel value for the location, $\sqrt{\overline{S^* \cdot S}}$, utilizes $\hat{S}$ after processing with image domain matrices.

12. A method of processing magnetic resonance imaging signals from a plurality of magnetic resonance imaging coils, comprising:
   receiving a corresponding plurality of signals, $d_1, d_2, \ldots, d_p$, from a corresponding plurality of magnetic resonance coils;
   producing signal vector $S=[s_1, s_2, \ldots, s_n]$, wherein the plurality of signals $s_1, s_2, \ldots, s_n$ represent a corresponding plurality of pixel values for a location, wherein each of the plurality of signals $s_1, s_2, \ldots, s_n$ is one of the plurality of signals $d_1, d_2, \ldots, d_p$ or a combination of two or more of the plurality of signals $d_1, d_2, \ldots, d_p$, wherein at least one of the plurality of signals $s_1, s_2, \ldots, s_n$ is a combination of two or more of the plurality of signals $d_1, d_2, \ldots, d_p$;
   determining a noise covariance matrix, N, of a plurality of magnetic resonance imaging coils or coil combinations corresponding to the plurality of signals $s_1, s_2, \ldots, s_n$, wherein each coil or coil combination corresponding to $S_i$ is the coil or combination of coils corresponding to the one of the plurality of signals $d_1, d_2, \ldots, d_p$ or the combination of two or more of the plurality of signals $d_1, d_2, \ldots, d_p$ used to produce $S_i$, where $S_i$ is one of the plurality of signals $s_1, s_2, \ldots, s_n$, wherein the noise covariance matrix, N, of the plurality of magnetic resonance imaging coils or coil combinations corresponding to the plurality of signals $s_1, s_2, \ldots, s_n$ is a Hermitian symmetric matrix;
   converting signal vector S to signal vector $\hat{S}$, where, $\hat{S}=(K^*)^{-1} \cdot S$ and $N=K^*K$, where K is a matrix for which the conjugate row-column transpose of K, $K^*$, multiplied by the matrix K is the noise covariance matrix, N;
   calculating a composite pixel value for the location, $\sqrt{\overline{S^* \cdot S}}$, where $\hat{S}^*=[(K^*)^{-1} \cdot S]^*$ and
   producing a pixel for the location in an image, wherein the pixel for the location in the image has the calculated composite pixel for the location.

13. The method according to claim 12, wherein converting signal vector S to signal vector $\hat{S}$ comprises converting signal vector S to signal vector $\hat{S}$ in the time domain.

14. The method according to claim 12, wherein $\hat{S}=[\hat{s}_1, \hat{s}_2, \ldots, \hat{s}_n]$ is produced by inputting $S=[s_1, s_2, \ldots, s_n]$ into a circuit, wherein the output of the circuit is $$\hat{s}_1 = a_{1,1}s_1 + a_{1,2}s_2 + \ldots + a_{1,n}s_n$$

$$\hat{s}_2 = a_{2,1}s_1 + a_{2,2}s_2 + \ldots + a_{2,n}s_n$$

$$\hat{s}_n = a_{n,1}s_1 + a_{n,2}s_2 + \ldots + a_{n,n}s_n$$

wherein $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are constants.

15. The method according to claim 14, wherein $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are values of $(K^*)^{-1}$ such that $a_{1,1}, a_{1,2}, \ldots, a_{1,n}, a_{2,1}, a_{2,2}, \ldots, a_{2,n}, \ldots a_{n,1}, a_{n,2}, \ldots, a_{n,n}$ are equal to $(K^*)^{-1}_{1,1}, (K^*)^{-1}_{1,2}, \ldots, (K^*)^{-1}_{1,n}, (K^*)^{-1}_{2,1}, (K^*)^{-1}_{2,2}, \ldots, (K^*)^{-1}_{2,n}, \ldots (K^*)^{-1}_{n,1}, (K^*)^{-1}_{n,2}, \ldots, (K^*)^{-1}_{n,n}$, respectively.

16. The method according to claim 15, wherein K is constructed via eigenvalue/vector decomposition of the noise covariance matrix N.

17. The method according to claim 16, wherein when the eigenvalue/vector decomposition of N yields one or more eigenvalues with substantially degenerate eigenvectors, the values of $(K^*)^{-1}$ are adjusted such that the output of the circuit is $\hat{S}=[\hat{s}_1, \hat{s}_2, \ldots, \hat{s}_m]$ where m<n.

18. The method according to claim 17, wherein substantially all of the image information in received signals $S=[s_1, s_2, \ldots, s_n]$ is in output signals $\hat{S}=[\hat{s}_1, \hat{s}_2, \ldots, \hat{s}_m]$.

19. The method according to claim 17, wherein the adjustment of the values of $(K^*)^{-1}$ results in the received signals with substantially the same eigenvalues being added together with a phase.

20. The method according to claim 19, wherein two of the received signals are received from quadrature volume coils having fields which are substantially uniform and substantially perpendicular, wherein the values of $(K^*)^{-1}$ are adjusted to accomplish the circularly polarized addition of the two received signals, such that substantially all of the image information in the two received signals is in one output signal.

21. The method according to claim 15, further comprising: pre-amplifying the received signals prior to inputting $S=[s_1, s_2, \ldots, s_n]$ into the circuit.

22. The method according to claim 21, further comprising:
   mixing output signal $\hat{S}$ to lower frequencies;
   sampling $\hat{S}$ with a lower frequency by A/D converters to produce a digital $\hat{S}$ signal;
   applying a 2D Fourier Transform to the digital $\hat{S}$ signal; and
   processing the $\hat{S}$ signal after 2D Fourier Transform applied with image domain matrices to produce a plurality of pixel values, $\hat{S}$, for a location,
   wherein a composite pixel value for the location, $\sqrt{\overline{S^* \cdot S}}$, utilizes $\hat{S}$ after processing with image domain matrices.

* * * * *

UNITED STATES PATENT AND TRADEMARK OFFICE
CERTIFICATE OF CORRECTION

PATENT NO. : 7,141,971 B2
APPLICATION NO. : 11/269968
DATED : November 28, 2006
INVENTOR(S) : G. Randy Duensing, Steve Varosi and Scott B. King It is certified that error appears in the above-identified patent and that said Letters Patent is hereby corrected as shown below:

Column 1,

Line 61, " $\left\langle \left(s_i - \langle s_i \rangle\right) \cdot \overline{\left(s_j - \langle s_j \rangle\right)} \right\rangle$ " should read -- $\left\langle \left(s_i - \langle s_i \rangle\right) \cdot \overline{\left(s_j - \langle s_j \rangle\right)} \right\rangle$ --.

Column 2,
Line 32, "take advantages of" should read -- take advantage of --.

Column 3,

Line 29, " $\left\langle \left(s_i - \langle s_i \rangle\right) \cdot \overline{\left(s_j - \langle s_j \rangle\right)} \right\rangle$ " should read -- $\left\langle \left(s_i - \langle s_i \rangle\right) \cdot \overline{\left(s_j - \langle s_j \rangle\right)} \right\rangle$ --.

Column 3,
Line 49, "coil receive profiles" should read -- coil receiver profiles --.

Column 4,
Line 14, " $\sqrt{\hat{S}^* \cdot \hat{S}}$ " should read -- $\sqrt{\hat{S}^* \cdot \hat{S}}$ --.

Column 6,
Lines 41-43, " $\sqrt{S^* \cdot [K^*k]^{-1} \cdot S}$ " should read -- $\sqrt{S^* \cdot [K^*K]^{-1} \cdot S}$ --.

Column 6,
Line 58, "(QL)" should read -- $(Q_L)$ --.

Column 6,
Line 60, "QL" should read -- $Q_L$ --.

UNITED STATES PATENT AND TRADEMARK OFFICE
CERTIFICATE OF CORRECTION

PATENT NO. : 7,141,971 B2
APPLICATION NO. : 11/269968
DATED : November 28, 2006
INVENTOR(S) : G. Randy Duensing, Steve Varosi and Scott B. King It is certified that error appears in the above-identified patent and that said Letters Patent is hereby corrected as shown below:

Column 9,
Line 29, "$d_p$or a" should read --$d_p$ or a--.

Signed and Sealed this

Fifth Day of June, 2007

JON W. DUDAS
*Director of the United States Patent and Trademark Office*